United States Patent

Yoshizawa et al.

[11] Patent Number: 5,982,247
[45] Date of Patent: Nov. 9, 1999

[54] CR OSCILLATING CIRCUIT

[75] Inventors: Hirokazu Yoshizawa; Kenichi Kobayashi, both of Tokyo, Japan

[73] Assignee: Seiko Instruments Inc., Japan

[21] Appl. No.: 09/177,813

[22] Filed: Oct. 23, 1998

[30] Foreign Application Priority Data

Oct. 24, 1997 [JP] Japan ............................... 9-292916

[51] Int. Cl.⁶ .................. H03K 3/02; H03K 3/26
[52] U.S. Cl. ............................. 331/143; 331/111
[58] Field of Search ....................... 363/50, 55, 56; 331/111, 113 R, 132, 143, 144, 150, 152

[56] References Cited

U.S. PATENT DOCUMENTS

| | | | |
|---|---|---|---|
| 4,344,293 | 8/1982 | Fujiwara et al. ............... | 62/126 |
| 4,414,515 | 11/1983 | Suzuki et al. ................ | 331/111 |
| 5,151,613 | 9/1992 | Satou et al. ................. | 307/243 |
| 5,729,722 | 3/1998 | Matsumoto .................... | 395/560 |

Primary Examiner—Matthew Nguyen
Attorney, Agent, or Firm—Adams & Wilks

[57] ABSTRACT

There is provided a CR oscillating circuit from which oscillation frequency is obtained as targeted, when MOS capacitors having large voltage dependency are used therein. The circuit is constructed such that bias voltage is applied always to the two MOS capacitors by connecting the two MOS, capacitors in series in the opposite direction from each other and by connecting further a MOSFET.

16 Claims, 11 Drawing Sheets

CR OSCILLATING CIRCUIT

BACKGROUND OF THE INVENTION

The present invention relates to a CR oscillating circuit using capacitors having large voltage dependency.

DESCRIPTION OF RELATED ART

FIG. 12 shows a structural example of a prior art CR oscillating circuit. Consider the time when the potential of an internal terminal 21 turns from high level to low level. At this time, the potential of an internal terminal 27 turns to high level. Then, by being influenced by the sharp drop of the potential of the internal terminal 21, the potential of a capacitor 10 connected between the internal terminal 21 and an internal terminal 19 on the side of one terminal 19 thereof drops sharply. Thereafter, the potential of the internal terminal 19 increases gradually in accordance to a CR time constant of a resistor 7 and the capacitor 10. Then, when the potential of the internal terminal 19 exceeds a threshold voltage of an inverter 1, the inverter 1 inverts and the potential of an internal terminal 20 turns to low level. Thereby, the potential of the internal terminal 2 turns to high level and the potential of the internal terminal 27 turns to low level. At this time, by being influenced by the sharp increase of the potential of the internal terminal 21, the potential of the capacitor 10 connected between the internal terminal 21 and the internal terminal 19 on the side of the terminal 19 increases sharply. Because the potential of the internal terminal 27 has turned to low level, the potential of the internal terminal 19 drops gradually in accordance to the CR time constant. Then, the potential exceeds the threshold voltage of the inverter 1, the inverter 1 inverts and the potential of the internal terminal 20 turns to high level. Thereby, the potential of the internal terminal 21 turns to low level and that of the internal terminal 27 turns to high level. The circuit shown in FIG. 12 repeats these operations and oscillates with frequency decided by the CR time constant.

However, the prior art CR oscillating circuit has had a problem that oscillation frequency cannot be obtained as targeted when a capacity having large voltage dependency, e.g., a MOS capacitor, is used because a capacitance varies depending on voltage between capacitors.

SUMMARY OF THE INVENTION

It is an object of the invention to provide a CR oscillating circuit from which targeted oscillation frequency is obtained when MOS capacitors having large voltage dependency are used therein.

In order to solve the above-mentioned problem, according to the invention, two capacitors are connected in series in the opposite direction from each other to compensate the voltage dependency of the capacitors and one MOSFET is connected further so that bias voltage is applied always to the two capacitors. Or, two capacitors are connected in series in the opposite direction from each other to compensate the voltage dependency of the capacitors and two switches and one capacitor are connected further so that bias voltage is applied always to the two capacitors. Because the capacitors operate only in the range where the voltage dependency is small in the circuit constructed as described above, the capacitance may be kept almost constant regardless of the voltage between the capacitors and the oscillation frequency may be obtained as targeted.

That is, in order to prevent the frequency of the CR oscillator from varying due to the large voltage dependency of the capacitor, an inventive CR oscillating circuit is constructed such that two MOS capacitors are connected in series in the opposite direction from each other and bias voltage is given to the connecting point thereof via a transistor so that the circuit operates while canceling the voltage dependency of the two MOS capacitors always from each other.

The MOS capacitor is desirable to be a MOS capacitor whose bottom electrode is n-type diffusion regions within an n-well and whose top electrode is a gate electrode to lessen the voltage dependency.

Further, because the MOS capacitor operates in the accumulating range where the voltage dependency is small by applying positive voltage to the top electrode as against to the bottom electrode, the capacitance may be fixed from the smaller bias voltage.

It is preferable to use positive power-supply voltage as the positive bias voltage because it eliminates the need for using a constant-voltage circuit and allows the circuit to be simplified.

While the positive bias voltage is applied to the connecting point of the two capacitors via the transistor, it is preferable to turn off the transistor when the potential of the bottom electrode of the capacitor turns to high level because it is possible to prevent the electric charge already accumulated by applying the positive bias voltage to the capacitor from being lost by doing so. To that end, it is preferable to use an NMOS transistor as the transistor because it turns off when the potential of a source is higher than that of a gate.

Further, it becomes unnecessary to give a control clock to the gate terminal of the NMOS transistor and the circuit may be simplified by short-circuiting the gate and the drain of the NMOS transistor.

The gate of the inverters may be protected from electrostatic breakdown by using two internal resistors when externally attached resistors are used as the resistors.

The positive bias voltage maybe applied to the connecting point of the two capacitors connected in series in the opposite direction from each other via a switched capacitor circuit comprising two switches and a capacitor. By constructing as described above, the transistor connected to the top electrode of the capacitors may be turned off before the potential of the bottom electrode of the capacitor turns to high level. Thereby, it is possible to prevent the electric charge already accumulated by applying the positive bias voltage to the capacitor from being lost.

It is also preferable to increase a number of inverter circuits connected in series because a lag is produced between the change of the output of the first inverter circuit and the change of the output of the fourth inverter circuit and because the transistor connected to the top electrode of the capacitor may be turned off more reliably before the potential of the bottom electrode of the capacitor turns to high level.

The specific nature of the invention, as well as other objects, uses and advantages thereof, will clearly appear from the following description and from the accompanying drawings in which like numerals refer to like parts.

DESCRIPTION OF PREFERRED EMBODIMENTS

Preferred embodiments of the present invention will be explained below with reference to the drawings.

Figure 1:
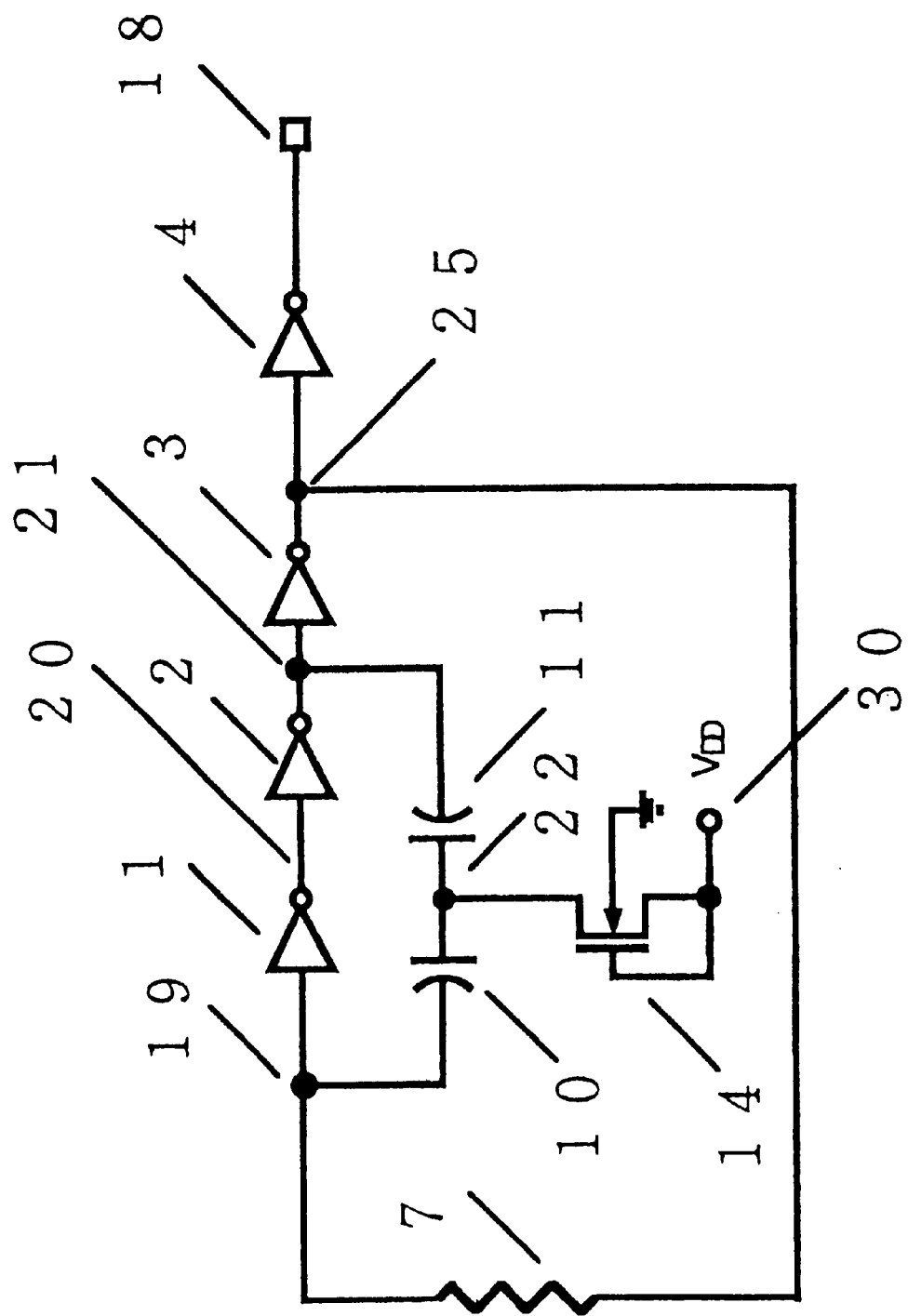
FIG. 1 is a circuit diagram showing the structure of a CR oscillating circuit of the present invention.
Figure 2:
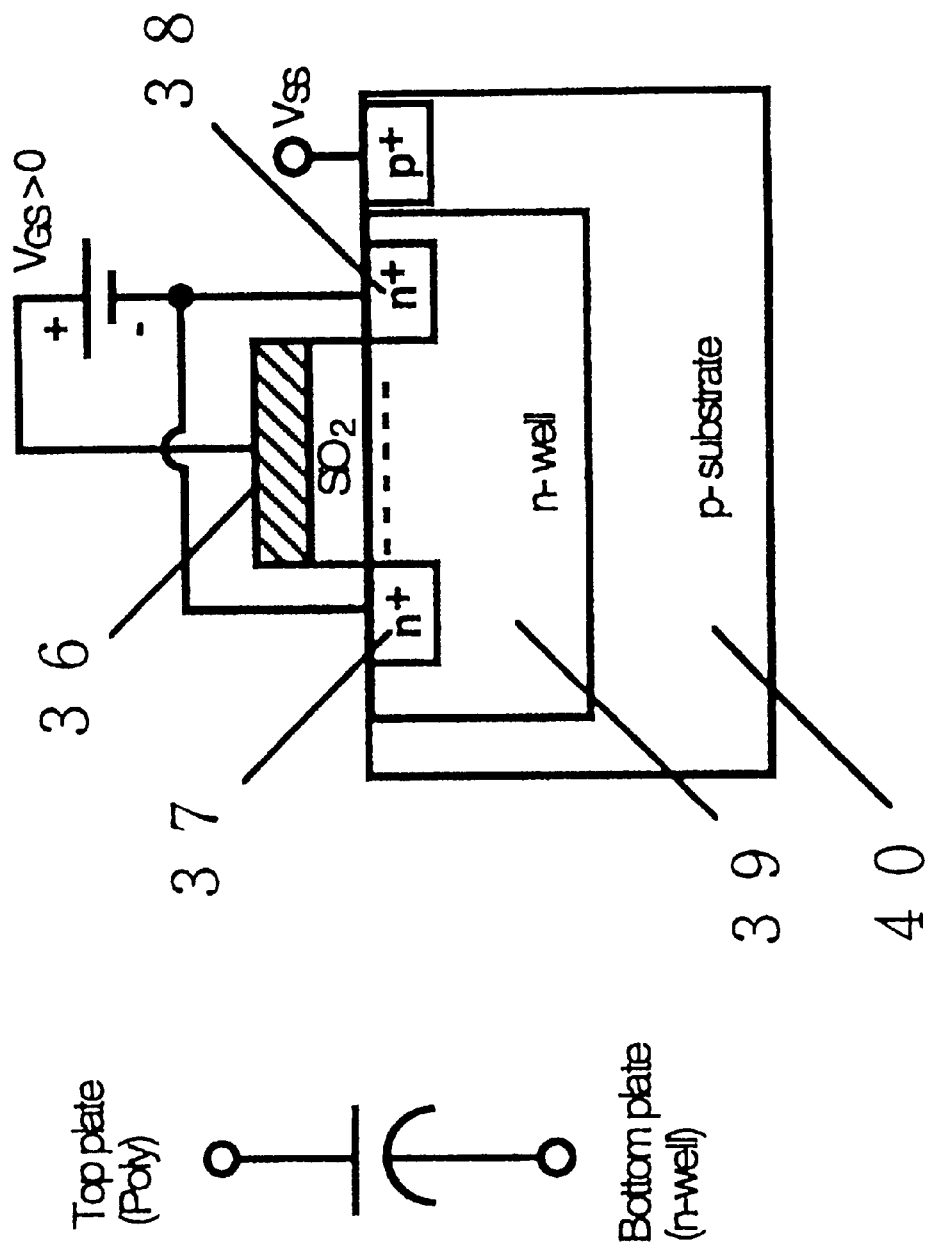
FIG. 2 is a diagram showing the structure of a MOS capacitor used in the invention.

FIG. 1 is a circuit diagram showing the structure of a CR oscillating circuit of the present invention. In FIG. 1, DC bias voltage 30 is positive bias voltage VDD=5V. FIG. 2 is a section view of MOS capacitors 10 and 11 used in FIG. 1. n-type diffusion regions 37 and 38 are formed within an n-well and become bottom electrodes of the capacitor. Meanwhile, a poly-silicon gate 36 corresponds to a top electrode thereof.

When internal terminals 19 and 21 are in the low level (0V) in FIG. 1, an internal terminal 22 is biased to VDD−$V_T$=4V. Accordingly, the MOS capacitors 10 and 11 have the bias voltage of 4 V, respectively. When the potential of the internal terminal 19 increases from 0 V and exceeds a threshold voltage (about 2.5 V) of an inverter 1, the output of the inverter 1 inverts and the potential of an internal terminal 20 turns to low level (0 V), that of the internal terminal 21 turns to high level (5 V) and that of an internal terminal 25 turns to low level (0 V). The internal terminal 22 is pre-biased to VDD−$V_T$=4V and this potential is a critical point where an NMOSFET 14 turns on/off. Accordingly, when the potential of the internal terminal 22 increases by being influenced by the sharp change of the potential of the internal terminal 21, the NMOSFET 14 turns off. Then, the potential of the internal terminal 22 increases along with the increase of the potential of the internal terminal 21. When the potential of the internal terminal 21 increases up to VDD (5V), the potential of the internal terminal 22 increases up to about 10 V. Then, by being influenced by the sharp change of the potential of the internal terminal 22, the potential of the internal terminal 19 connected to one end of the capacitor increases sharply up to about 7 V. It then drops gradually thereafter due to the influence of the CR time constant. As the potential of the internal terminal 19 decreases, the potential of the internal terminal 22 also decreases gradually.

Then, when the potential of the internal terminal 19 drops below the threshold voltage (about 2.5 V) of the inverter 1, the output of the inverter 1 inverts and the potential of the internal terminal 20 turns to high level (5 V), that of the internal terminal 21 turns to low level (0 V) and that of the internal terminal 25 turns to high level (5 V). By being influenced by the sharp decrease of the potential of the internal terminal 21, the potential of the internal terminal 22 decreases to about 4 V. In the same time, the potential of the internal terminal 19 also drops to −1 V. Thereafter, the potential of the internal terminal 19 increases gradually due to the influence of the CR time constant.

Thus, the positive bias voltage is applied always to the two MOS capacitors 10 and 11 during when the circuit is operative and the MOS capacitors 10 and 11 operate always in an accumulating range where the voltage dependency is small. Further, the MOS capacitors 10 and 11 operate so that a capacitance of the other capacitor decreases when a capacitance of one capacitor increases, so that the total capacitance of the capacitors connected in series is almost constant because their non-linearity is canceled each other.

What should be noticed on here is that the directions of the MOS capacitors 10 and 11. Because there exists a relatively large non-linear parasitic capacitor at the bottom of the MOS capacitors 10 and 11, it is necessary to avoid this bottom from being connected to a high impedance terminal. Due to that, it is desirable to have a circuit structure in which gate electrodes of the MOS capacitors 10 and 11 are connected each other as shown in FIG. 1.

Figure 3:
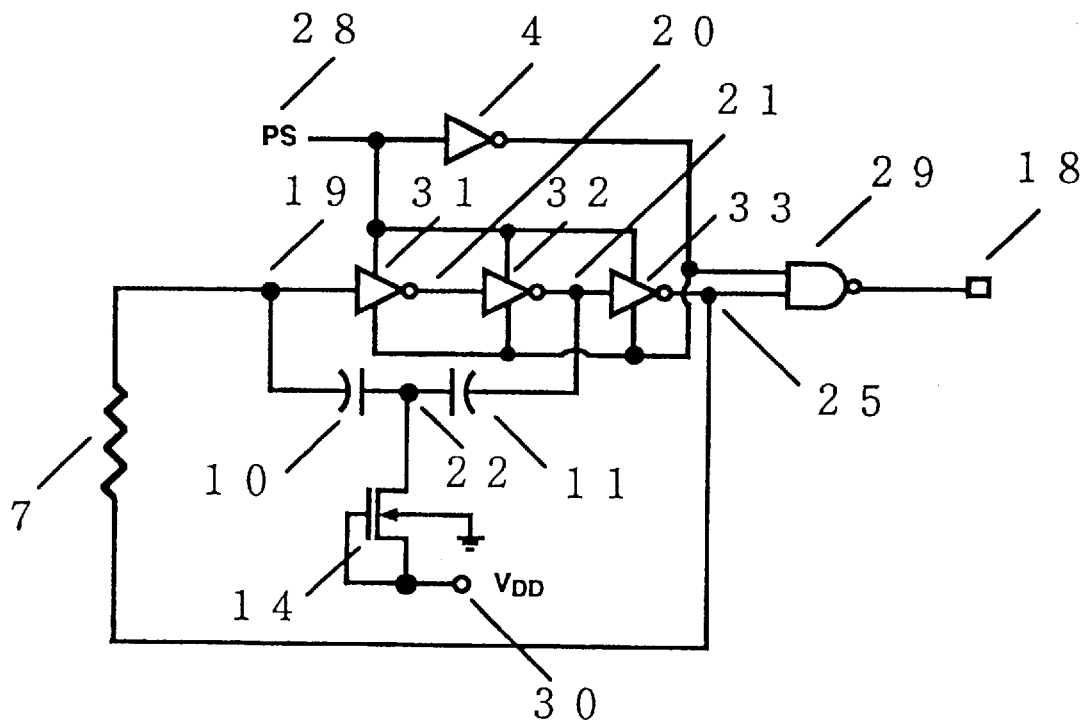
FIG. 3 is a circuit diagram showing the structure of a CR oscillating circuit attached with a power save mode of the invention.

FIG. 3 is a circuit diagram showing the structure of a CR oscillating circuit attached with a power save mode. When a power save mode terminal 28 is in the high level, clocked inverters 31, 32 and 33 are turned off and an output of an NAND circuit 29 is fixed to high level in the same time. When the power save mode terminal 28 is in the low level, the clocked inverters 31, 32 and 33 and the NAND circuit 29 operate as inverters, so that the CR oscillating circuit oscillates in the same manner with the circuit shown in FIG. 1.

Figure 4:
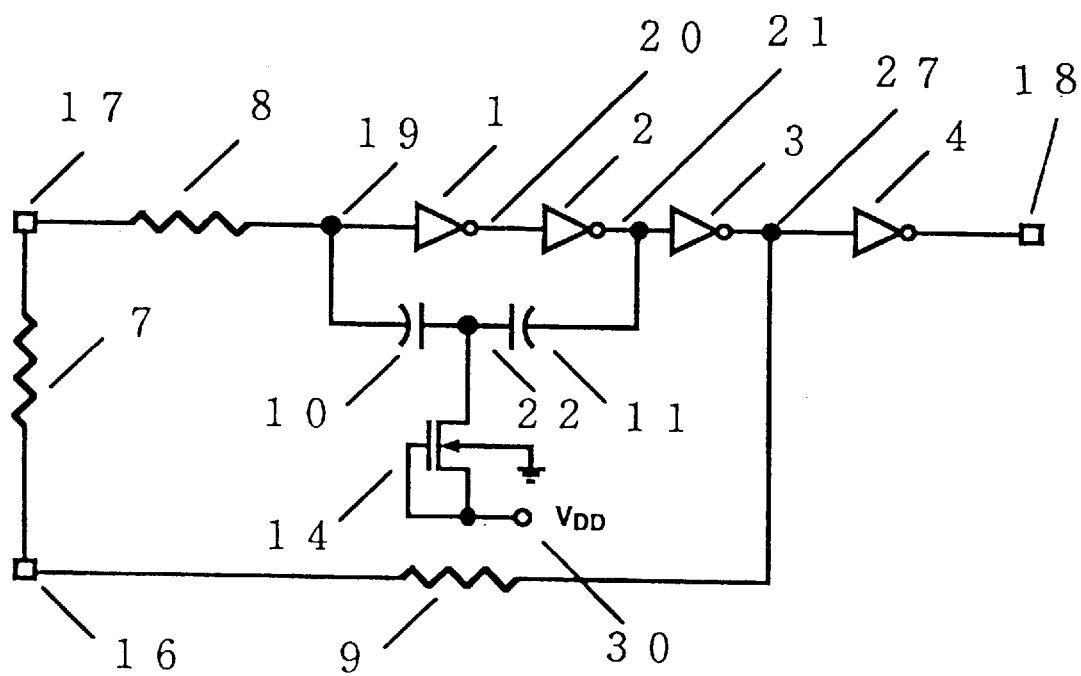
FIG. 4 is a circuit diagram showing the structure of a CR oscillating circuit attached with externally attached resistors of the invention.

FIG. 4 is a circuit diagram showing the structure of a CR oscillating circuit attached with externally attached resistors. Internal resistors 8 and 9 are inserted, in addition to an external resistor 7, in order to prevent electrostatic breakdown of gate oxide films of the inverters 1 and 4. The operation of the circuit is totally the same with that of the circuit of FIG. 1.

Figure 5:
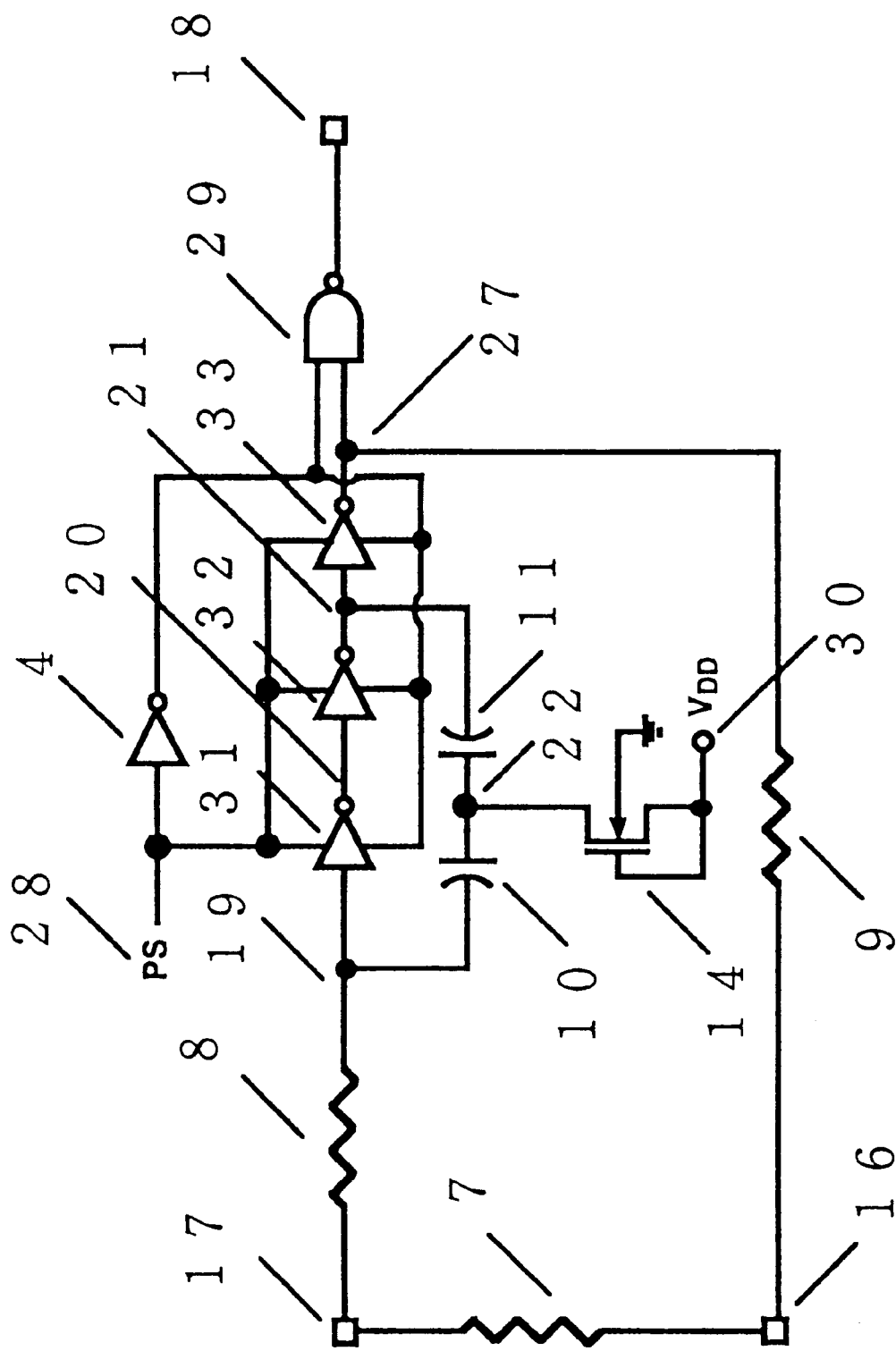
FIG. 5 is a circuit diagram showing the structure of a CR oscillating circuit attached with the externally attached resistor and with the power save mode of the invention.

FIG. 5 is a circuit diagram showing the structure of a CR oscillating circuit attached with the externally attached resistors and with the power save mode. It is provided with the resistors 8 and 9 for preventing the electrostatic breakdown and with an inverter 4, the clocked inverters 31, 32 and 33 and the NAND circuit 29 for the power save mode. The operation of the circuit is totally the same with that of the circuit of FIG. 3.

Figure 6:
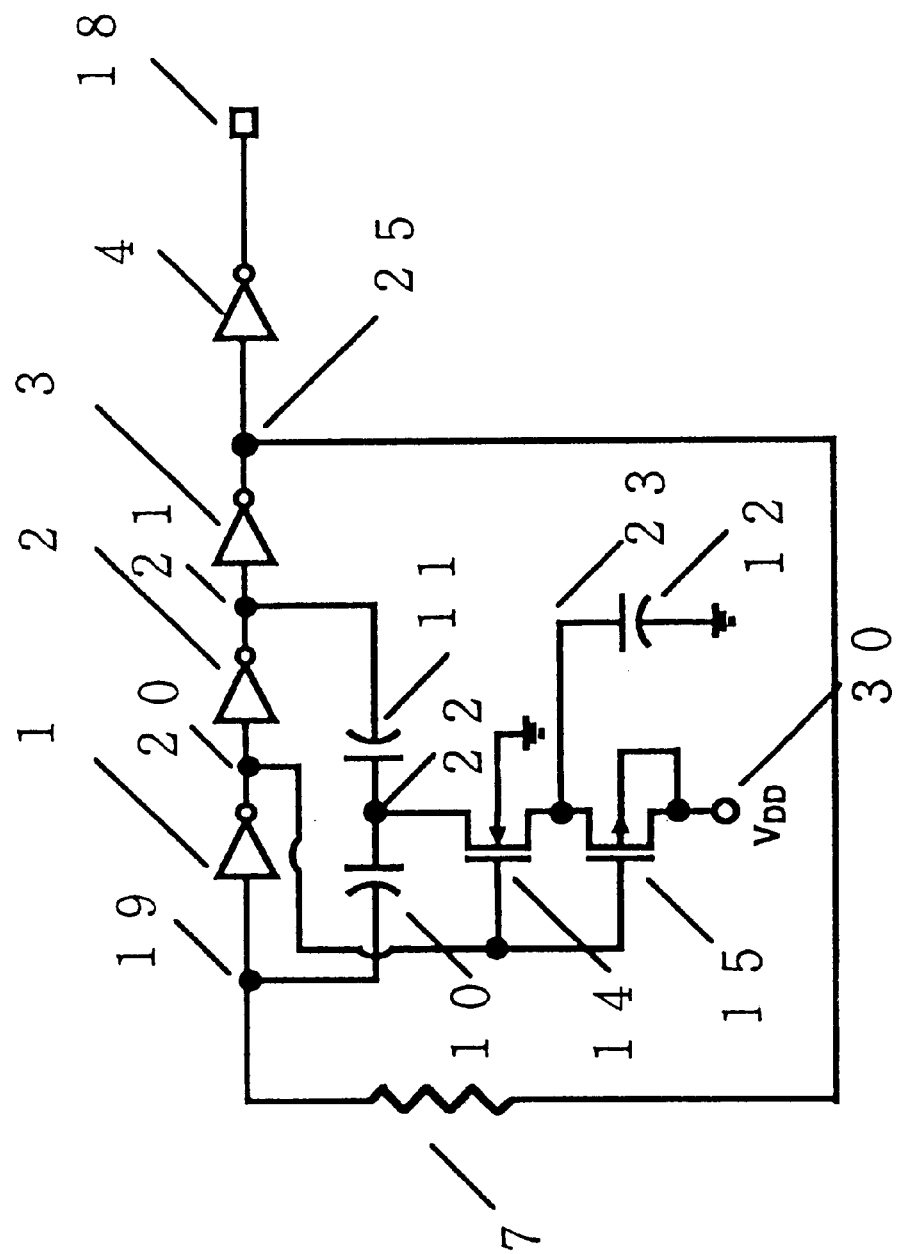
FIG. 6 is a circuit diagram showing the structure of another CR oscillating circuit of the present invention.

FIG. 6 is a circuit diagram showing the structure of a CR oscillating circuit according to another embodiment. In this circuit, a switched capacitor circuit comprising a capacitor 12, an NMOSFET 14 and a PMOSFET 15 is used to compensate the voltage dependency of the MOS capacitors 10 and 11. The operation of the circuit is the same with that of the circuit shown in FIG. 1. When the internal terminals 19 and 21 are in the low level, the NMOSFET 14 turns on, thus biasing the internal terminal 22 to high level. When the internal terminals 19 and 21 are in the high level, the NMOSFET 14 turns off and causes the internal terminal 22 to be a high impedance terminal. Thereby, the two capacitors connected in series always have positive bias voltage and operate in the accumulating range.

Figure 7:
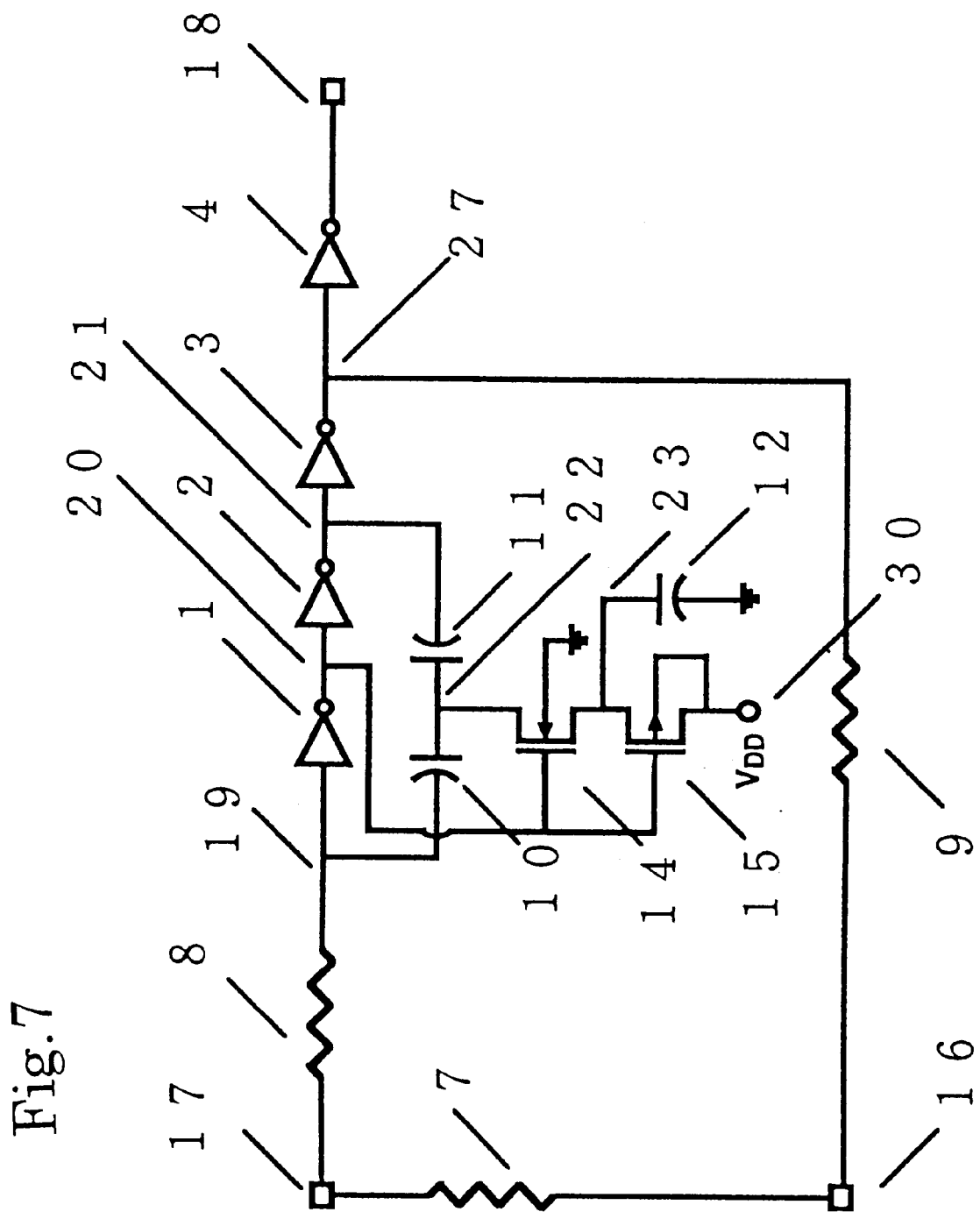
FIG. 7 is a circuit diagram showing the structure of another CR oscillating circuit attached with externally attached resistors of the invention.

FIG. 7 is a circuit diagram showing the structure of another CR oscillating circuit attached with externally attached resistors. The resistors 8 and 9 are inserted in order to prevent the electrostatic breakdown of the gate oxide films of the inverters 1 and 4. The operation of the circuit is totally the same with that of the circuit of FIG. 6.

Figure 8:
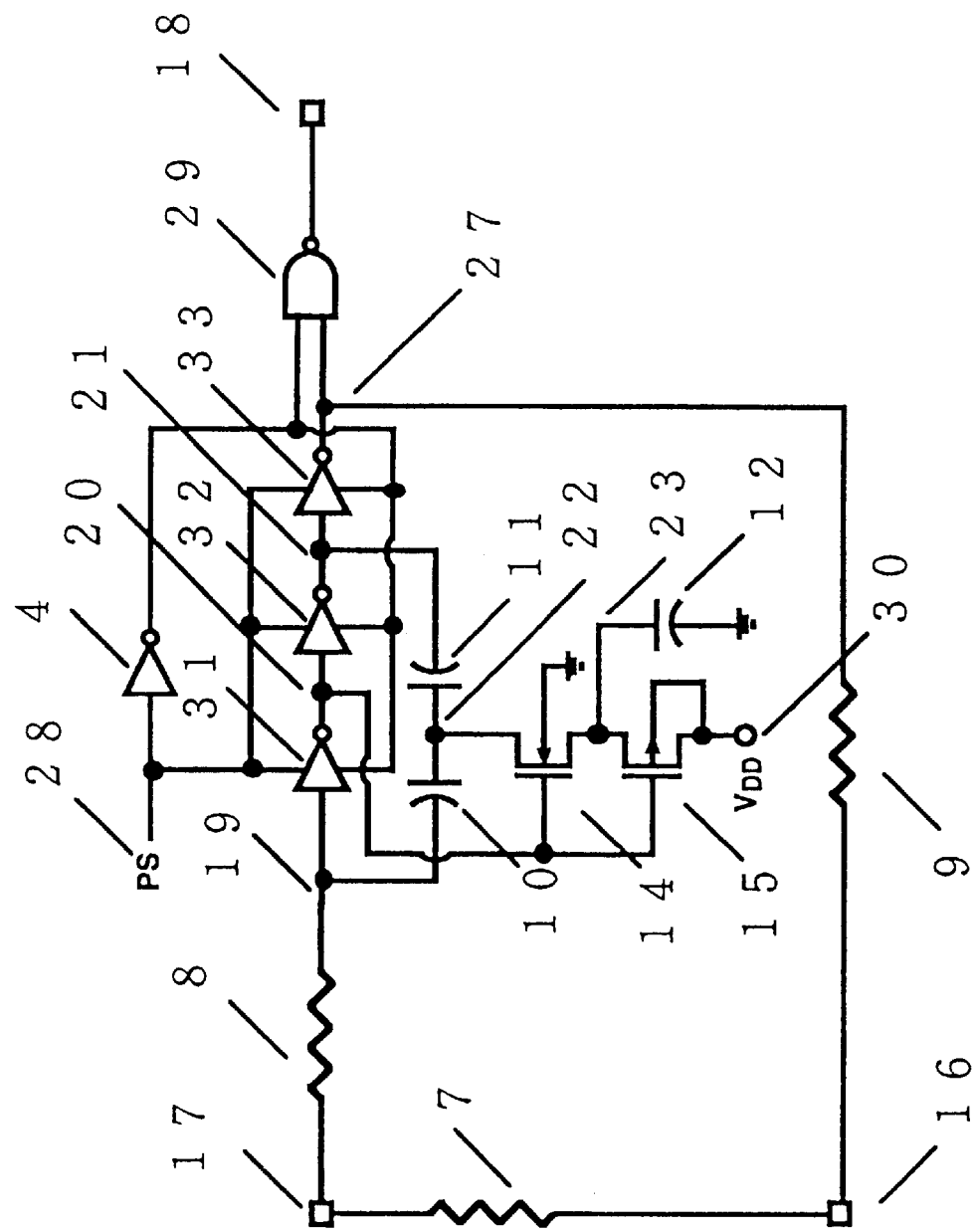
FIG. 8 is a circuit diagram showing the structure of another CR oscillating circuit attached with the externally attached resistor and with the power save mode of the invention.

FIG. 8 is a circuit diagram showing the structure of another CR oscillating circuit attached with the externally attached resistors and with the power save mode. It is provided with the resistors 8 and 9 for preventing the electrostatic breakdown and with the inverter 4, the clocked inverters 31, 32 and 33 and the NAND circuit 29 for the power save mode. When the power save mode terminal 28 is in the high level, the clocked inverters 31, 32 and 33 turn off and the output of the NAND circuit 29 is fixed to high level in the same time. When the power save mode terminal 28 is in the low level, the clocked inverters 31, 32 and 33 and the NAND circuit 29 operate as inverters, so that the circuit oscillates in the same manner with the circuit shown in FIG. 6.

Figure 9:
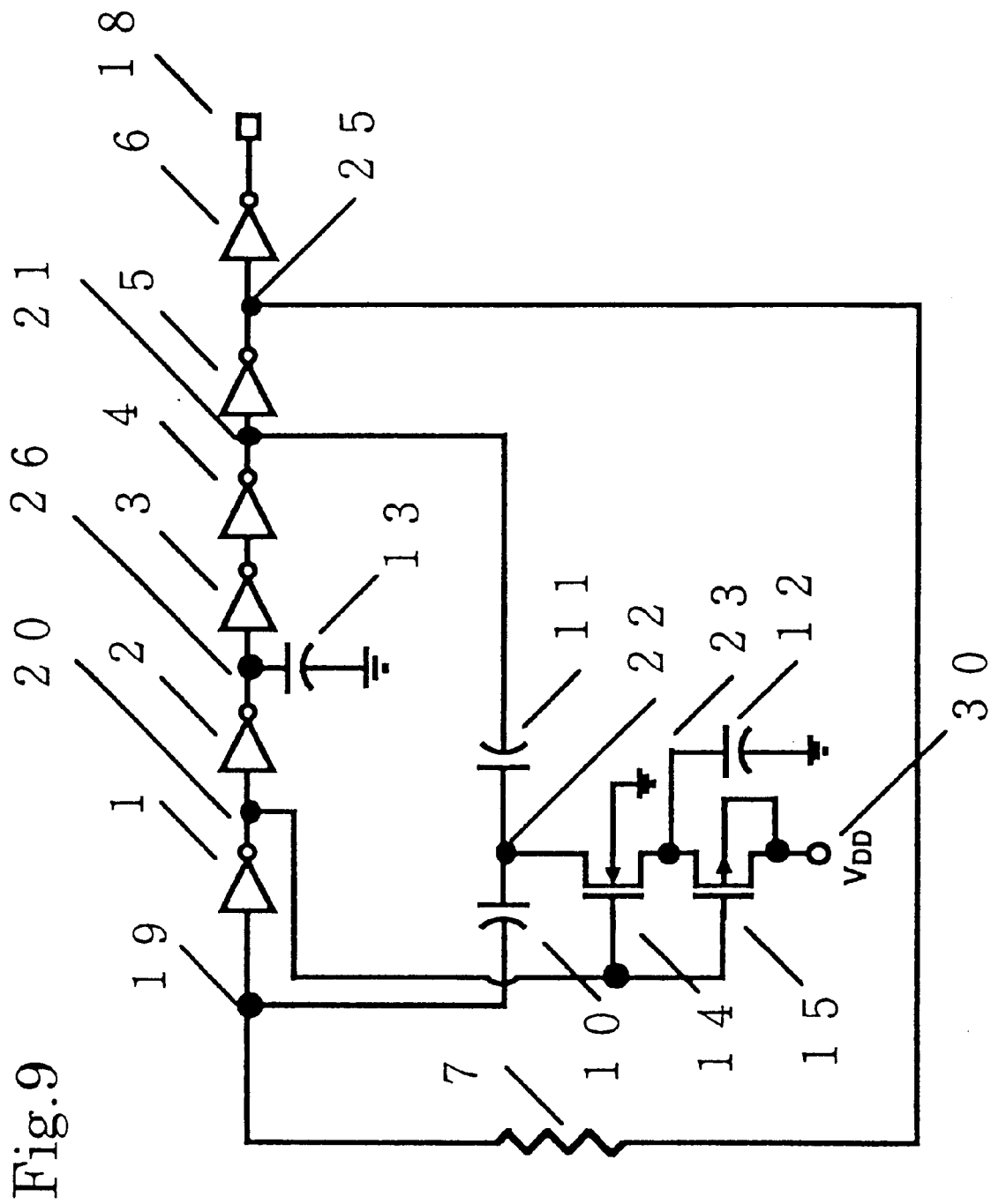
FIG. 9 is a circuit diagram showing the structure of a still other CR oscillating circuit of the present invention.

FIG. 9 is a circuit diagram showing the structure of a CR oscillating circuit according a still other embodiment. When the NMOSFET 14 continues to be on when the internal terminal 21 turns from low level to high level, the pre-biased electric charge is lost, thus decreasing the bias voltage of the MOS capacitors 10 and 11. In order to prevent that, a lag is give between the internal terminal 20 and the internal terminal 21 in this circuit. Thereby, the NMOSFET 14 may be completely turned off before the potential of the internal terminal 21 changes.

Figure 10:
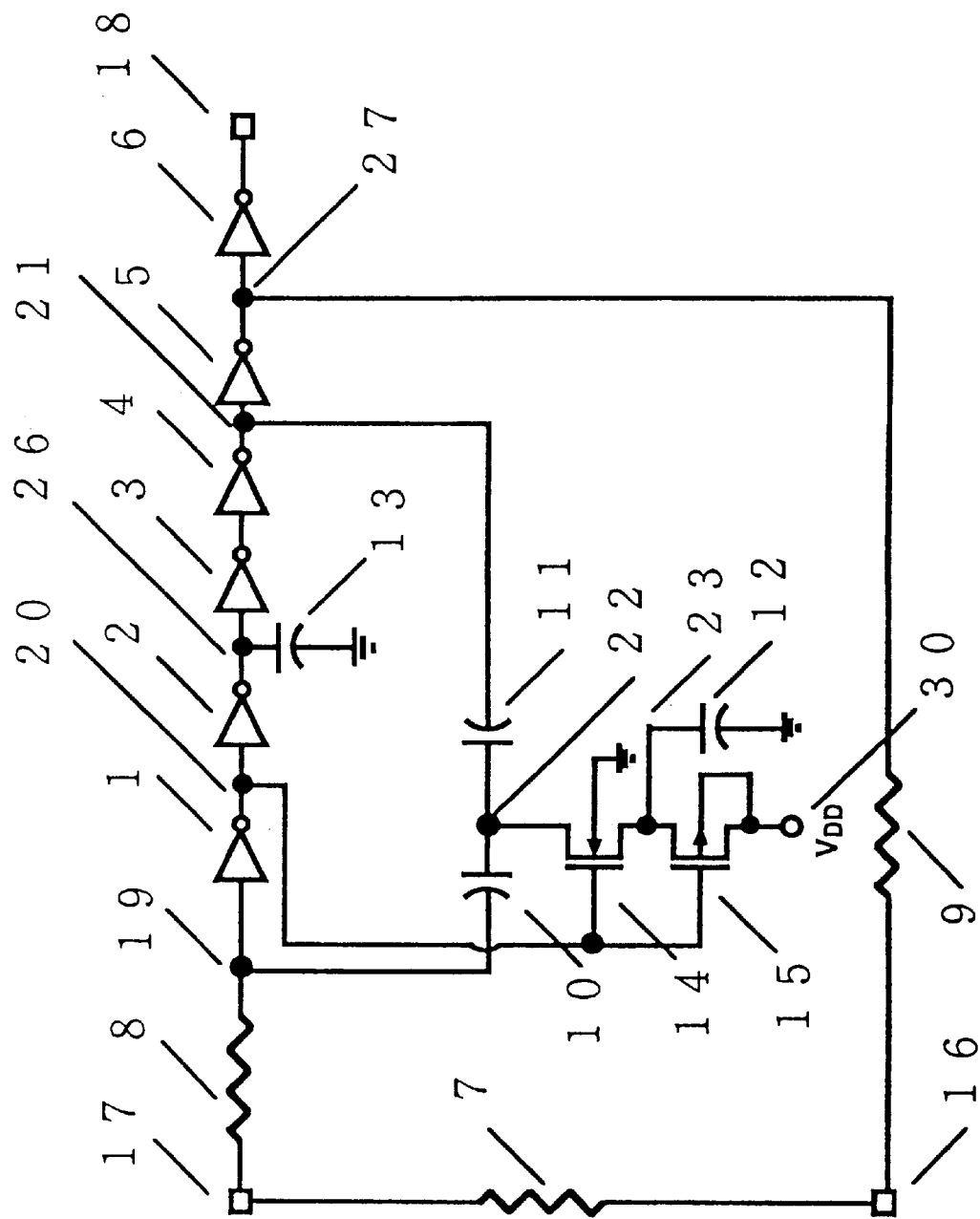
FIG. 10 is a circuit diagram showing the structure of a still other CR oscillating circuit attached with externally attached resistors of the invention.

FIG. 10 is a circuit diagram showing the structure of another CR oscillating circuit attached with the externally attached resistors. The resistors 8 and 9 are inserted in order to prevent the electrostatic breakdown of the gate oxide films of the inverters 1 and 6. The operation of the circuit is totally the same with that of the circuit of FIG. 9.

Figure 11:
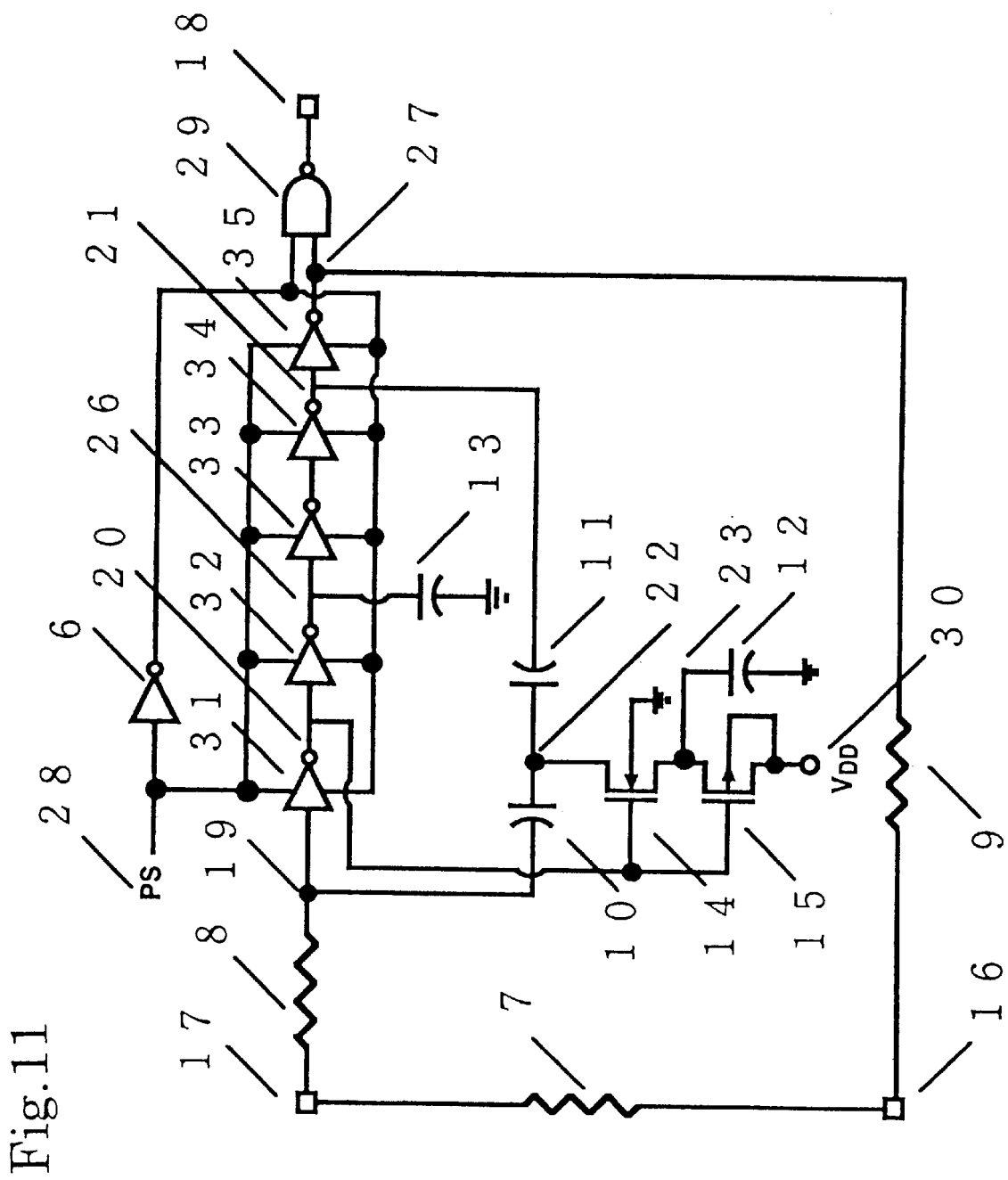
FIG. 11 is a circuit diagram showing the structure of a still other CR oscillating circuit attached with the externally attached resistor and with the power save mode of the invention.
Figure 12:
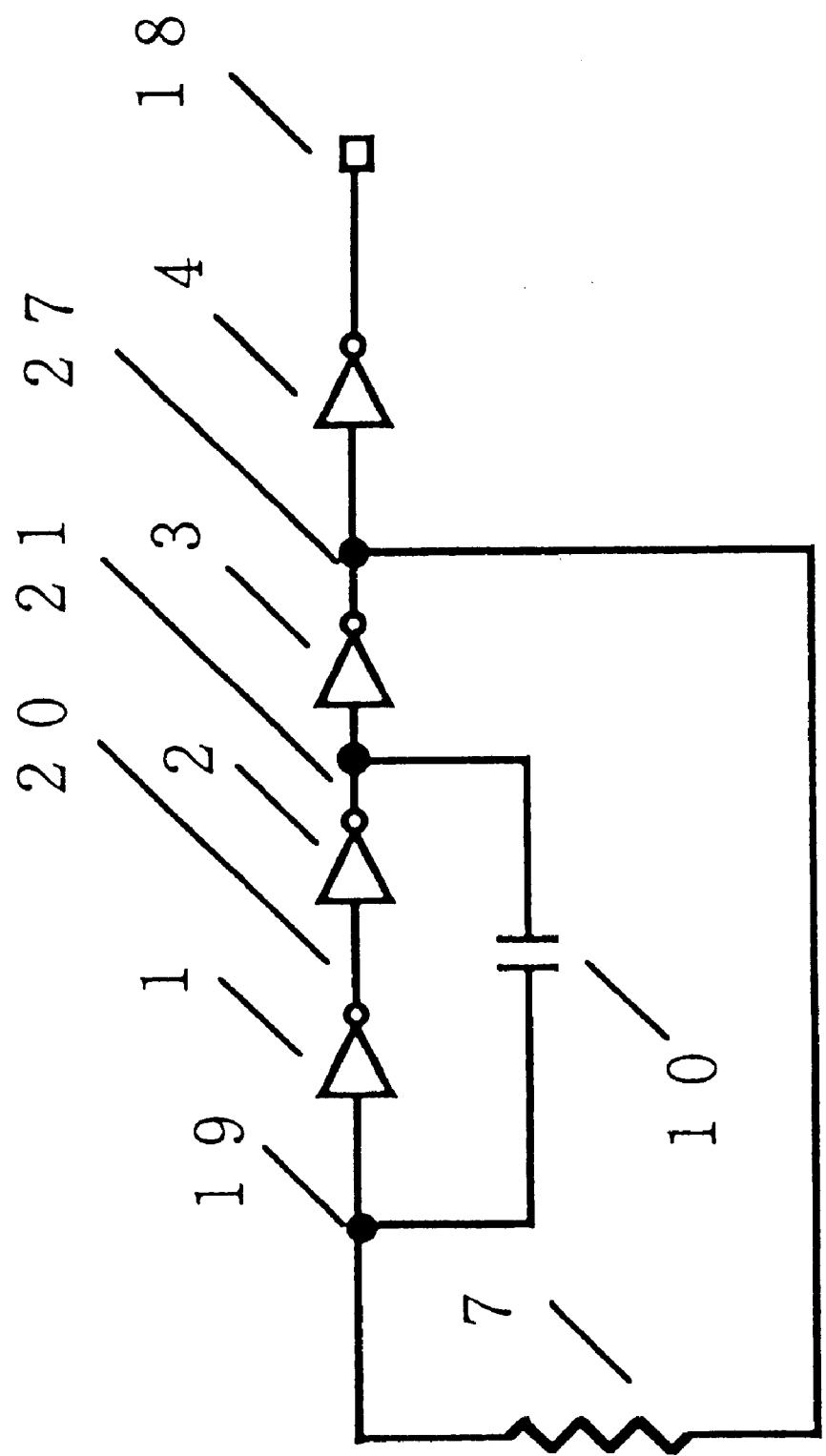
FIG. 12 is a circuit diagram showing the structure of a prior art CR oscillating circuit.

FIG. 11 is a circuit diagram showing the structure of another CR oscillating circuit attached with the externally attached resistors and with the power save mode. It is provided with the resistors 8 and 9 for preventing the electrostatic breakdown and with the inverter 4, the clocked inverters 31, 32 and 33 and the NAND circuit 29 for the power save mode. When the power save mode terminal 28 is in the high level, the clocked inverters 31, 32 and 33 turn off and the output of the NAND circuit 29 is fixed to high level in the same time. When the power save mode terminal 28 is in the low level, the clocked inverters 31, 32 and 33 and the NAND circuit 29 operate as inverters, so that the circuit oscillates in the same manner with the circuit shown in FIG. 9.

As described above, according to the invention, in order to prevent the frequency of the CR oscillator from varying due to the large voltage dependency of the capacitors, the two MOS capacitors are connected in series in the opposite direction from each other and the bias voltage is applied to the connecting point thereof via the transistor. Thereby, the circuit operates while always canceling the voltage dependency of the two MOS capacitors each other. Further, because the capacitors operate only in the range where the voltage dependency is small, the capacitance may be almost fixed and the CR oscillating circuit having targeted oscillation frequency may be realized even in the basic digital CMOS process having no capacitor having small voltage dependency. Accordingly, the cost may be lowered as compared to the prior art method.

Because the above-mentioned MOS capacitor is a MOS capacitor whose bottom electrode is the n-type diffusion regions within the n-well and whose top electrode is a gate electrode, its voltage dependency is small as compared to other MOS capacitors.

Further, the MOS capacitor operates in the accumulating range where the voltage dependency is small by applying the positive voltage to the top electrode as against to the bottom electrode, the capacitance may be fixed from the smaller bias voltage.

It becomes unnecessary to use a constant-voltage circuit by using the positive power-supply voltage as the positive bias voltage, so that the circuit structure maybe simplified.

It is also possible to prevent the electric charge already accumulated in the capacitor from being lost because the NMOS transistor turns off when the potential of the bottom electrode of the capacitor turns to high level by applying the positive bias voltage to the connecting point of the two capacitors via the transistor.

Still more, it is not necessary to give a control clock to a gate terminal of the NMOS transistor by short-circuiting the gate and the drain of the NMOS transistor so that the circuit structure may be simplified.

The gate of the inverter may be protected from the electrostatic breakdown by using the two internal resistors when the externally attached resistors are used as resistors.

The transistor connected to the top electrode of the capacitor may be turned off before the potential of the top electrode of the capacitor turns to high level by arranging so as to apply the positive bias voltage to the connecting point of the two capacitors connected in series in the opposite direction from each other via the switched capacitor circuit comprising the two switches and the capacitor. Thereby, it is possible to prevent the electric charge already accumulated in the capacitors by applying the positive bias voltage to the capacitor from being lost.

Still more, the transistor connected to the top electrode of the capacitor may be turned off more reliably before the potential of the bottom electrode of the capacitor turns to high level and it is possible to prevent the electric charge already accumulated in the capacitor from being lost by increasing a number of the inverter circuits connected in series because a lag is created between the change of the output of the first inverter circuit and the change of the output of the fourth inverter circuit.

While the preferred embodiments have been described, variations thereto will occur to those skilled in the art within the scope of the present inventive concepts which are delineated by the following claims.

What is claimed is:

1. A CR oscillating circuit, comprising:
    first through third inverter circuits connected in series in serial order;
    a gate circuit connected to an output terminal of said third inverter circuit;
    a first resistor connected between the output terminal of said third inverter circuit and an input terminal of said first inverter circuit;
    a first capacitor whose one end is connected to an output terminal of said second inverter circuit;
    a second capacitor connected between the other end of said first capacitor and the input terminal of said first inverter circuit; and
    a MOS transistor connected between a connecting point of said first capacitor and said second capacitor and DC bias voltage applying means;
    said first and second capacitors being MOS capacitors whose bottom electrode is n-type diffusion regions within an n-well and whose top electrode is a gate electrode and positive bias voltage being applied to said top electrode, as against to said bottom electrode, by said DC bias voltage applying means.

2. The CR oscillating circuit according to claim 1, wherein the DC bias voltage consists of power-supply voltage.

3. The CR oscillating circuit according to claim 1, wherein said MOS transistor is composed of an NMOS transistor.

4. The CR oscillating circuit according to claim 3, wherein diode-connection is made in said MOS transistor by short-circuiting a gate terminal and a drain terminal.

5. A CR oscillating circuit, comprising:

first through third inverter circuits connected in series in serial order;

a gate circuit connected to an output terminal of said third inverter circuit;

first, second and third resistors connected in series in serial order between the output terminal of said third inverter circuit and an input terminal of said first inverter circuit;

a first capacitor connected to an output terminal of said second inverter circuit;

a second capacitor connected between the other end of said first capacitor and the input terminal of said first inverter circuit; and a MOS transistor connected between a connecting point of said first capacitor and said second capacitor and DC bias voltage applying means;

said first and second capacitors being MOS capacitors whose bottom electrode is n-type diffusion regions within an n-well and whose top electrode is a gate electrode and positive bias voltage being applied to said top electrode, as against to said bottom electrode, by said DC bias-voltage applying means.

6. The CR oscillating circuit according to claim 5, wherein the DC bias voltage consists of power-supply voltage.

7. The CR oscillating circuit according to claim 5, wherein the MOS transistor is composed of an NMOS transistor.

8. The CR oscillating circuit according to claim 7, wherein diode-connection is made in said MOS transistor by short-circuiting a gate terminal and a drain terminal.

9. A CR oscillating circuit, comprising:

first through third inverter circuits connected in series in serial order;

a gate circuit connected to an output terminal of said third inverter circuit;

a first resistor connected between the output terminal of said third inverter circuit and an input terminal of said first inverter circuit;

a first capacitor whose one end is connected to an output terminal of said second inverter circuit;

a second capacitor connected between the other end of said first capacitor and the input terminal of said first inverter circuit;

a first MOS transistor whose one main electrode other than a gate terminal is connected to a connecting point of said first capacitor and said second capacitor and whose gate terminal is controlled by a signal from an output terminal of said first inverter circuit;

a second MOS transistor whose one main electrode other than a gate terminal is connected between the main electrode other than the gate terminal of said first MOS transistor and DC bias voltage applying means and said gate terminal is controlled by a signal from the output terminal of said first inverter circuit; and a third capacitor connected to a connecting point of said first MOS transistor and said second MOS transistor;

said first, second and third capacitors being MOS capacitors whose bottom electrode is n-type diffusion regions within an n-well and whose top electrode is a gate electrode and positive bias voltage being applied to said top electrode, as against to said bottom electrode, by said DC bias voltage applying means.

10. The CR oscillating circuit according to claim 9, wherein the DC bias voltage consists of power-supply voltage.

11. A CR oscillating circuit, comprising:

first through third inverter circuits connected in series in serial order;

a gate circuit connected to an output terminal of said third inverter circuit;

first, second and third resistors connected in series in serial order between the output terminal of said third inverter circuit and an input terminal of said first inverter circuit;

a first capacitor whose one end is connected to an output terminal of said second inverter circuit;

a second capacitor connected between the other end of said first capacitor and the input terminal of said first inverter circuit;

a first MOS transistor whose one main electrode other than a gate terminal is connected to a connecting point of said first capacitor and said second capacitor and whose gate terminal is controlled by a signal from the output terminal of said first inverter circuit;

a second MOS transistor whose one main electrode other than a gate terminal is connected between the main electrode other than the gate terminal of said first MOS transistor and DC bias voltage applying means and said gate terminal is controlled by a signal from the output terminal of said first inverter circuit; and a third capacitor connected to a connecting point of said first MOS transistor and said second MOS transistor;

said first second and third capacitors being MOS capacitors whose bottom electrode is n-type diffusion regions within an n-well and whose top electrode is a gate electrode and positive bias voltage being applied to said top electrode, as against to said bottom electrode, by said DC bias voltage applying means.

12. The CR oscillating circuit according to claim 11, wherein the DC bias voltage consists of power-supply voltage.

13. A CR oscillating circuit, comprising:

first through fifth inverter circuits connected in series in serial order;

a gate circuit connected to an output terminal of said fifth inverter circuit;

a first resistor connected between the output terminal of said fifth inverter circuit and the input terminal of said first inverter circuit;

a first capacitor connected to said second inverter circuit;

a second capacitor whose one end is connected to an output terminal of said fourth inverter circuit;

a third capacitor connected between the other end of said second capacitor and the input terminal of said first inverter circuit;

a first MOS transistor whose one main electrode other than a gate terminal is connected to a connecting point of said first capacitor and said third capacitor and whose gate terminal is controlled by a signal from the output terminal of said first inverter circuit;

a second MOS transistor whose one main electrode other than a gate terminal is connected between the main electrode other than the gate terminal of said first MOS transistor and DC bias voltage applying means and said gate terminal is controlled by a signal from the output terminal of said first inverter circuit; and a fourth capacitor connected to a connecting point of said first MOS transistor and said second MOS transistor;

said first through fourth capacitors being MOS capacitors whose bottom electrode is n-type diffusion regions within an n-well and whose top electrode is a gate electrode and positive bias voltage being applied to said top electrode, as against to said bottom electrode, by said DC bias voltage applying means.

14. The CR oscillating circuit according to claim 13, wherein the DC bias voltage consists of power-supply voltage.

15. A CR oscillating circuit, comprising:

first through fifth inverter circuits connected in series in serial order;

a gate circuit connected to an output terminal of said fifth inverter circuit;

first, second and third resistors, connected in series in serial order between the output terminal of said fifth inverter circuit and an input terminal of said first inverter circuit;

a first capacitor connected to said second inverter circuit;

a second capacitor whose one end is connected to an output terminal of said fourth inverter circuit;

a third capacitor connected between the other end of said second capacitor and an input terminal of said first inverter circuit;

a first MOS transistor whose one main electrode other than a gate terminal is connected to a connecting point of said first capacitor and said third capacitor and whose gate terminal is controlled by a signal from an output terminal of said first inverter circuit;

a second MOS transistor whose one main electrode other than a gate terminal is connected between the main electrode other than the gate terminal of said first MOS transistor and DC bias voltage applying means and said gate terminal is controlled by a signal from the output terminal of said first inverter circuit; and a fourth capacitor connected to a connecting point of said first MOS transistor and said second MOS transistor;

said first through fourth capacitors being MOS capacitors whose bottom electrode is n-type diffusion regions within an n-well and whose top electrode is a gate electrode and positive bias voltage being applied to said top electrode, as against to said bottom electrode, by said DC bias voltage applying means.

16. The CR oscillating circuit according to claim 15, wherein the DC bias voltage consists of power-supply voltage.

* * * * *